(12) United States Patent
Ohtaka

(10) Patent No.: US 6,566,157 B2
(45) Date of Patent: May 20, 2003

(54) ALIGNMENT MARKS AND METHOD OF FORMING THE SAME

(75) Inventor: Shiro Ohtaka, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/769,448

(22) Filed: Jan. 26, 2001

(65) Prior Publication Data

US 2002/0028528 A1 Mar. 7, 2002

(30) Foreign Application Priority Data

Sep. 1, 2000 (JP) ....................................... 2000-265492

(51) Int. Cl.[7] .............................................. H01L 21/00
(52) U.S. Cl. ...................... 438/48; 250/548; 257/752; 257/797; 438/401; 438/462; 438/975
(58) Field of Search .................. 250/548; 257/752, 257/797; 438/401, 462, 975

(56) References Cited

U.S. PATENT DOCUMENTS 5,969,428 A * 10/1999 Nomura et al. ............. 257/752
6,207,966 B1 * 3/2001 Nguyen et al. ............. 250/548
6,242,816 B1 * 6/2001 Stanton et al. ............. 257/797

FOREIGN PATENT DOCUMENTS

JP          11354415 A     12/1999

* cited by examiner

Primary Examiner—David Nelms
Assistant Examiner—Mai-Huong Tran
(74) Attorney, Agent, or Firm—Rabin & Berdo, PC

(57) ABSTRACT

Alignment marks and a method of forming the alignment marks are provided. The method includes the steps of forming a first alignment mark in an alignment mark forming area on the substrate, forming an opaque layer that is opaque to the alignment light above the alignment mark forming area where the first alignment mark is formed, substantially flattening a surface of the opaque layer, and forming a second alignment mark on a side where the alignment light is incident with respect to the flattened opaque layer.

7 Claims, 7 Drawing Sheets

ALIGNMENT MARKS AND METHOD OF FORMING THE SAME

BACKGROUND OF THE INVENTION

1. Field of the Invention

The present invention relates to alignment marks used for alignment in manufacturing a semiconductor device or the like, and relates to a method of forming the alignment marks.

2. Description of Related Art

Alignment of a photomask is carried out by the use of alignment marks formed on a substrate where circuit components or elements are formed, when a device such as a semiconductor device or a liquid crystal display is manufactured. The elements are formed on the substrate by carrying out the mask alignment in a predetermined processing step among various processes such as layer formation and impurity doping. A manufacturing process of a semiconductor integrated circuit will be described as an example hereinbelow.

Conventionally, alignment marks are formed in an area, for example, a scribe area where the circuit elements are not formed in patterning process of a circuit pattern on a wafer of a silicon (Si) substrate 1 or the like. The process will be described with reference to the sectional view of FIG. 1. An alignment mark 2 which has differences in surface level or a step-like form is formed at a first alignment mark forming area. The alignment mark 2 is formed by using, for example, a conventional photolithography technique. More specifically, a photoresist layer is applied on the silicon substrate 1. The photoresist layer is exposed using a photomask and is subject to patterning process. An etching process is, then, performed on the substrate 1 to form a predetermined mark-form.

A first upper layer 3 is, then, formed on the alignment mark 2. A second alignment mark 4 is then formed at a position different from the position of the alignment mark 2 by etching the first upper layer 3 through the similar processing steps as mentioned above. An alignment mark is sequentially formed on each deposited layer by performing the above-mentioned steps repeatedly.

A new alignment mark, however, needs to be formed at a place where no alignment mark is formed in the conventional alignment mark forming method. Therefore, an area for arranging alignment marks becomes insufficient as the number of steps of the wafer processing increases. Additionally, a problem occurs where the superposition accuracy decreases as separation increases between the position of an alignment mark used for exposure processing and the position of an alignment mark used for measurement of the superposition accuracy. The alignment marks used for the wafer processing, therefore, need to be formed with high accuracy even in a case in which many process steps are performed.

SUMMARY OF THE INVENTION

The present invention has been made in view of the foregoing, and an object of the present invention is to provide alignment marks and a method of forming the alignment marks in which the area for the alignment marks can be reduced and alignment can be performed with high accuracy.

According to the present invention, there is provided a method of forming alignment marks that can be detected by alignment light to form elements on a substrate, which comprises the steps of forming a first alignment mark in an alignment mark forming area on the substrate, forming an opaque layer that is opaque to the alignment light above the alignment mark forming area where the first alignment mark is formed, substantially flattening a surface of the opaque layer, and forming a second alignment mark on a side where the alignment light is incident with respect to the flattened opaque layer.

According to the present invention, there is provided a method of forming alignment marks that can be detected by alignment light to form elements on a substrate, which comprises the steps of forming a first alignment mark in an alignment mark forming area on the substrate, forming at least one layer on the alignment mark forming area where the first alignment mark is formed, substantially flattening a surface of the at least one layer, and forming a second alignment mark on the flattened surface of the at least one layer, wherein the second alignment mark has a shape to intercept reflected alignment light from the first alignment mark.

According to the present invention, there is provided alignment marks that can be detected by alignment light to form elements on a substrate, which comprises a first alignment mark formed in an alignment mark forming area on the substrate, an opaque layer, which is opaque to the alignment light, formed above the first alignment mark, a surface of the opaque layer being substantially flattened, and a second alignment mark formed on a side where the alignment light is incident with respect to the flattened opaque layer.

According to the present invention, there is provided alignment marks that can be detected by alignment light to form elements on a substrate, which comprises a first alignment mark formed in an alignment mark forming area on the substrate, at least one layer formed above the first alignment mark, a surface of the at least one layer being substantially flattened, and a second alignment mark formed on the flattened surface of the at least one layer, wherein the second alignment mark has a shape to intercept reflected alignment light from the first alignment mark.

DETAILED DESCRIPTION OF THE PREFERRED EMBODIMENTS

Embodiments of the present invention will be described in detail with reference to the attached drawings.

[First Embodiment]

Figure 1:
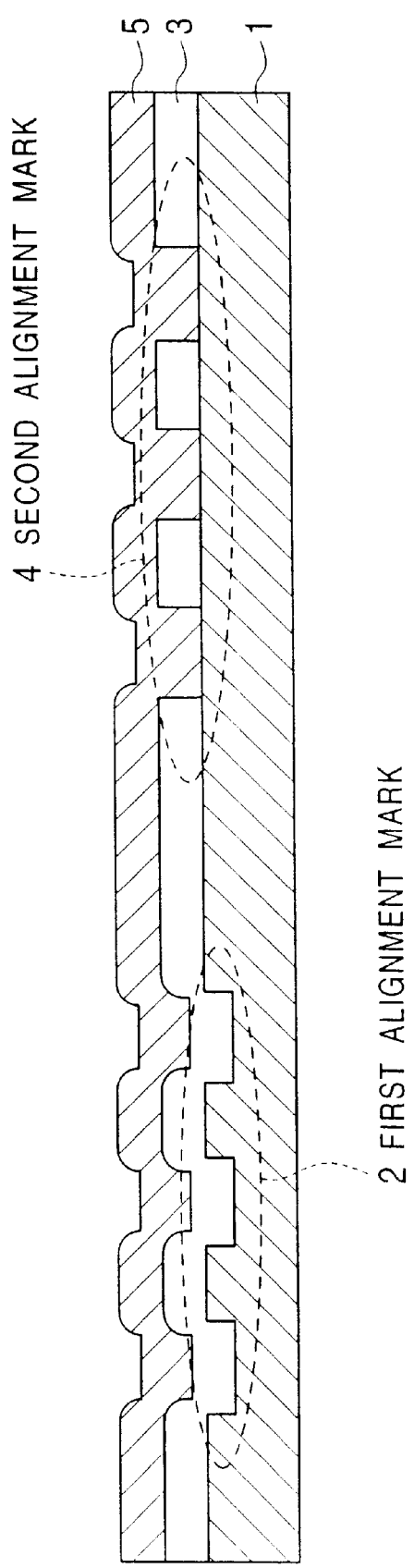
FIG. 1 shows a sectional view illustrating the structure of conventional alignment marks.
Figure 2:
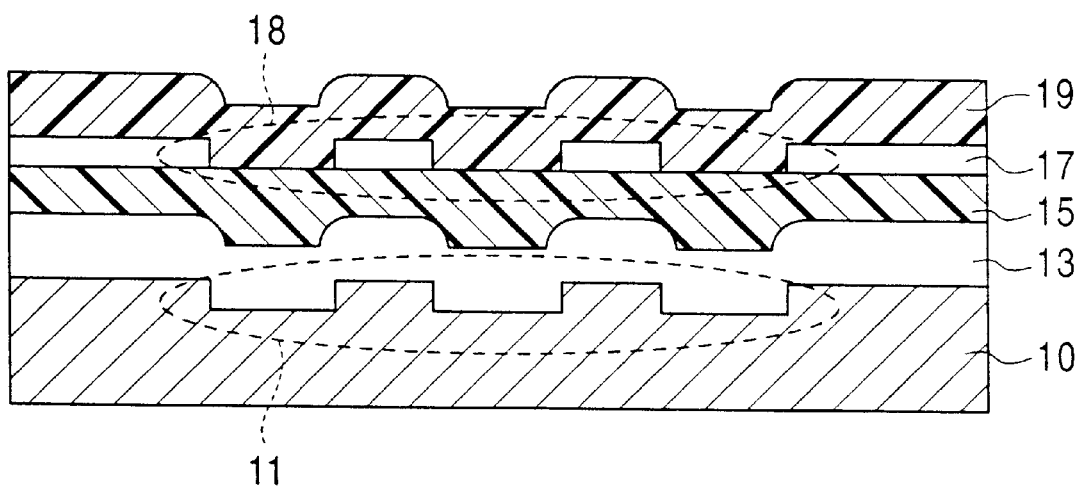
FIG. 2 shows a sectional view of a semiconductor wafer which has alignment marks according to a first embodiment of the present invention.

FIG. 2 is a sectional view of a semiconductor wafer that has alignment marks according to a first embodiment of the present invention. A first alignment mark having a step-like form is formed on the surface of a silicon (Si) substrate 10. A first upper layer 13 and a second upper layer 15 are formed on the first alignment mark 11. The second upper layer 15 is made of a material opaque to alignment light used for alignment in a wafer process, described later. It is noted that, in general, a laser beam, such as He—Ne laser, or white light is used as the alignment light.

The upper surface of the second upper layer 15 is substantially flat, and a third upper layer 17 including a second alignment mark 18 is formed on the second upper layer 15. Additionally, a fourth upper layer 19 is deposited on the second alignment mark 18.

A method of forming the first and the second alignment marks 11 and 18 will be described with reference to FIGS. 3 and 4. The alignment marks are formed by using a commonly-used photolithography technique. A photoresist layer is formed on the substrate 10, and the photoresist layer is patterned into a predetermined form of alignment mark by using a photomask. Thereafter, the first alignment mark 11 that has differences in surface level like a rectangular wave or step-like form is formed by performing etching process. In this process, a polishing mark 20 used in a polishing process, which has a deeper difference in level or a groove than the first alignment mark 11, is formed beforehand (see FIG. 3A).

Alignment in various wafer processes is carried out by using the first alignment mark 11. In such wafer processes, an oxide layer ($SiO_2$) that is the first upper layer 13 is deposited by, for example, a CVD (chemical vapor deposition) method (see FIG. 3B). The $SiO_2$ layer is, for example, an insulating layer used in forming a semiconductor device. Thereafter, an opaque layer opaque to alignment light is formed (see FIG. 3C) as the second upper layer 15. The opaque layer is a polysilicon (Poly-Si) layer used as a gate electrode.

Figure 3A:
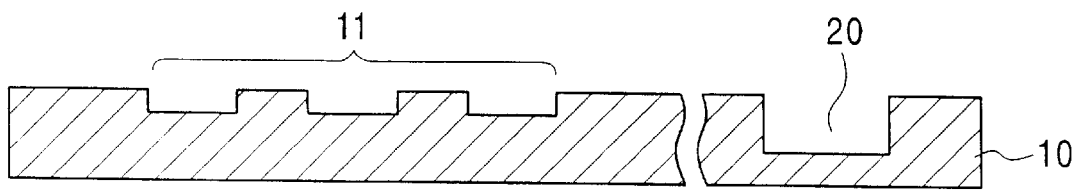
FIGS. 3A to 3D are sectional views illustrating processing steps until surface-flattening processing after the formation of a first alignment mark in the first embodiment of the present invention shown in FIG. 2, FIGS. 4A and 4B are sectional views which show steps of forming a second alignment mark on the surface that has undergone the surface-flattening processing in the first embodiment of the present invention shown in FIG. 2.
Figure 3B:
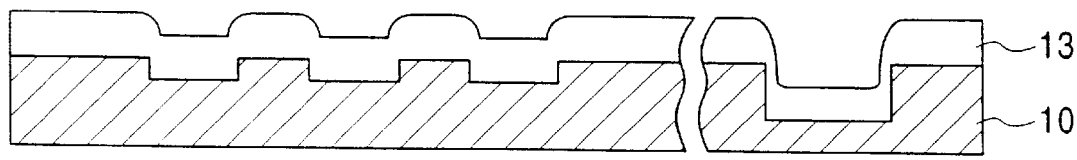
Figure 3C:
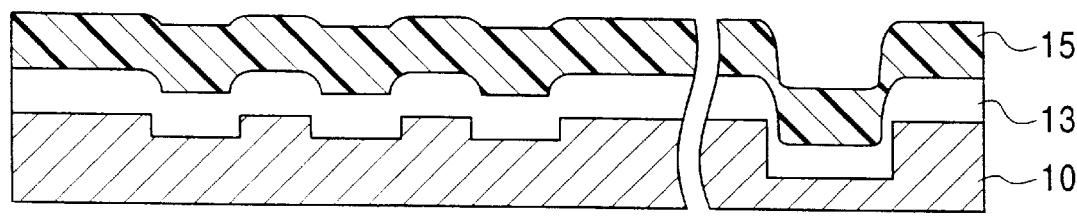
Figure 3D:
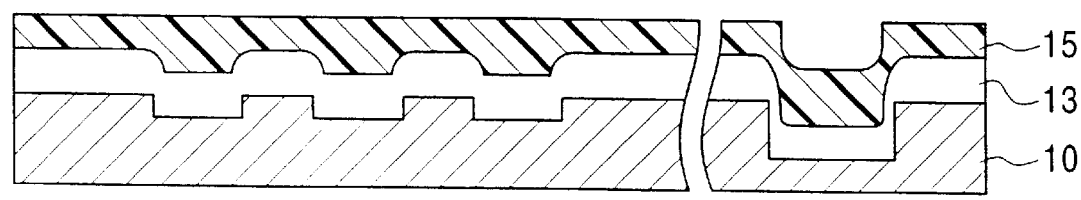

After that, in a chemical-mechanical polishing (CMP) process, the surface of the second upper layer 15 undergoes flattening processing so as to become substantially flat by polishing (see FIG. 3D). The first alignment mark 11 disappears after the flattening processing, however, the polishing mark 20 does not disappear because the difference in level thereof is deeper.

Figure 4A:
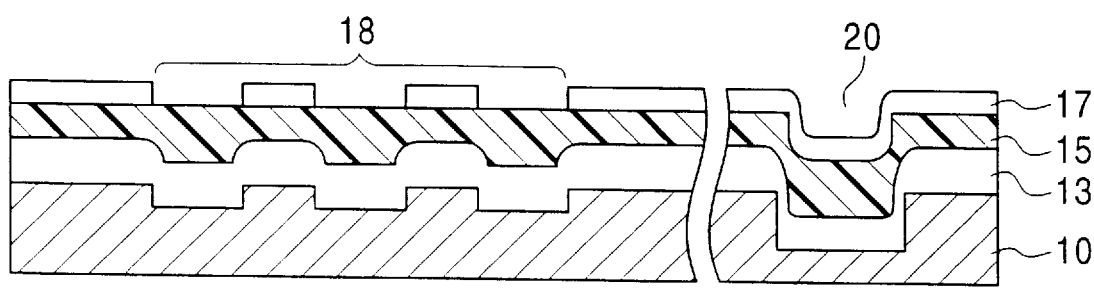
Figure 4B:
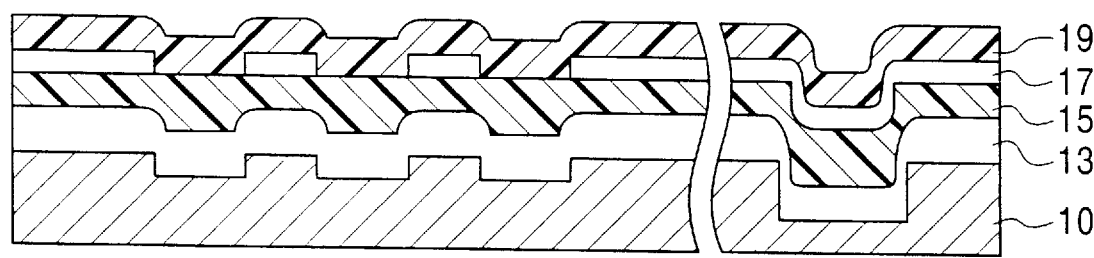

FIGS. 4A and 4B are sectional views showing a process for forming the second alignment mark 18 after finishing the flattening processing. The $SiO_2$ layer that is the third upper layer 17 is deposited above an area where the first alignment mark 11 is formed. As in the case of the first alignment mark 11, the second alignment mark 18 is formed by patterning the $SiO_2$ layer 17 using the polishing mark 20 (see FIG. 4A) as a third alignment mark. The area needed for disposing alignment marks can be reduced by forming the second alignment mark 18 above the region where the first alignment mark 11 is formed.

It should be noted that the pattern of the second alignment mark 18 does not necessarily have to be the same as that of the first alignment mark 11. The second alignment mark 18, also, does not necessarily have to be the same in size as the first alignment mark 11. Additionally, the second alignment mark 18 does not have to be positioned directly above the first alignment mark 11, and, if part of the second alignment mark 18 is positioned over the first alignment mark 11, the are for disposition or layout thereof can be reduced. Instead of disposing the mark 20, other marks that can be placed on a substrate and be used for alignment may be used as the third alignment mark so as to form the second alignment mark 18.

Alignment in various processes is carried out by using the second alignment mark 18. An aluminum (Al) layer that is a wiring electrode, for example, is formed as the fourth upper layer 19 in a wafer process in which the second alignment mark 18 (see FIG. 4B) is used. As mentioned above, the second upper layer 15 that is formed under the second alignment mark 18 and has undergone the flattening processing is an opaque layer that is opaque to the alignment light. Therefore, a situation does not occur in which alignment light reflected by the first alignment mark 11 exerts an adverse influence on the alignment processing. Additionally, the second alignment mark 18 has a highly accurate shape since the mark 18 is formed on a flat surface. Therefore, an alignment process can be performed with high accuracy by using the second alignment mark 18.

Figure 5:
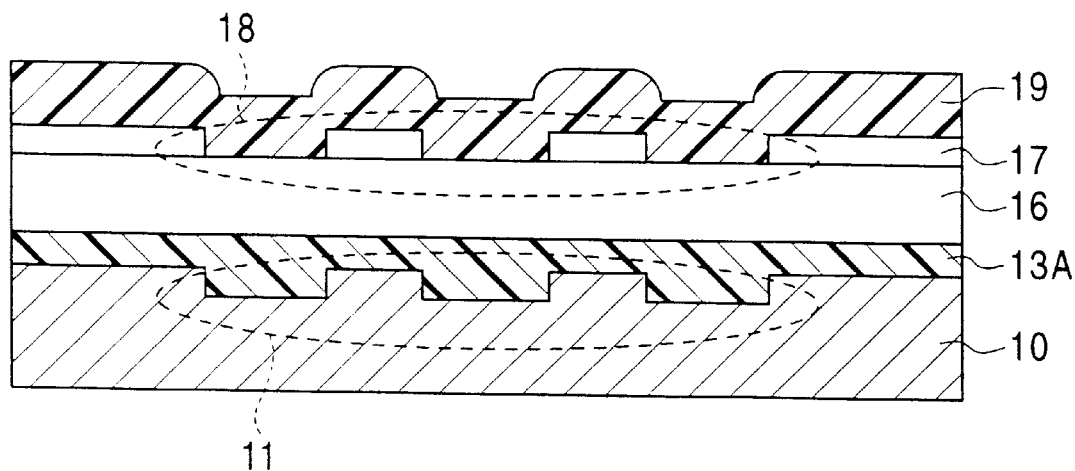
FIG. 5 is a sectional view of a semiconductor wafer that illustrates alignment marks according to a modification of the first embodiment of the present invention.

A modification of the embodiment will be described hereinafter with reference to the attached drawings. An opaque layer that is opaque to alignment light may be used as a first upper layer 13A deposited on the first alignment mark 11, and the opaque layer 13A may be flattened as shown in FIG. 5. In this case, a second upper layer 16 (for example, an $SiO_2$ layer) deposited on the opaque layer 13A is deposited so as to become substantially flat, and the second alignment mark 18 may be formed on the second upper layer 16.

Figure 6:
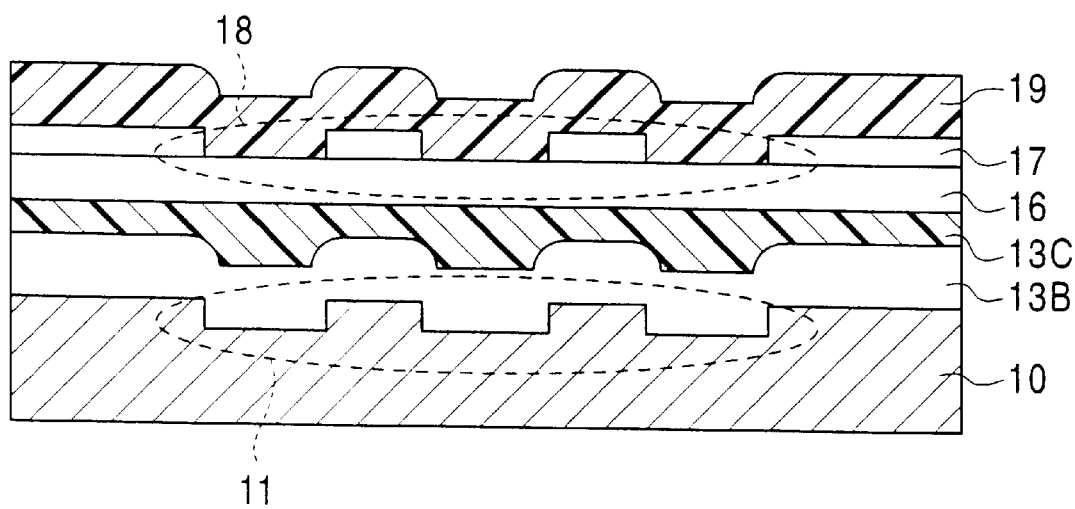
FIG. 6 is a sectional view of a semiconductor wafer that illustrates alignment marks according to another modification of the first embodiment of the present invention.

Alternatively, as shown in FIG. 6, an opaque layer 13C may be formed as an upper layer, and may be flattened. In other words, all that is necessary is that an opaque layer whose surface (i.e., upper surface) is substantially flat is included in the layers above the first alignment mark 11. As mentioned above, according to the present invention, an alignment mark can be realized that is capable of reducing an area needed for disposing the alignment mark and capable of performing alignment with high accuracy.

[Second Embodiment]

Figure 7:
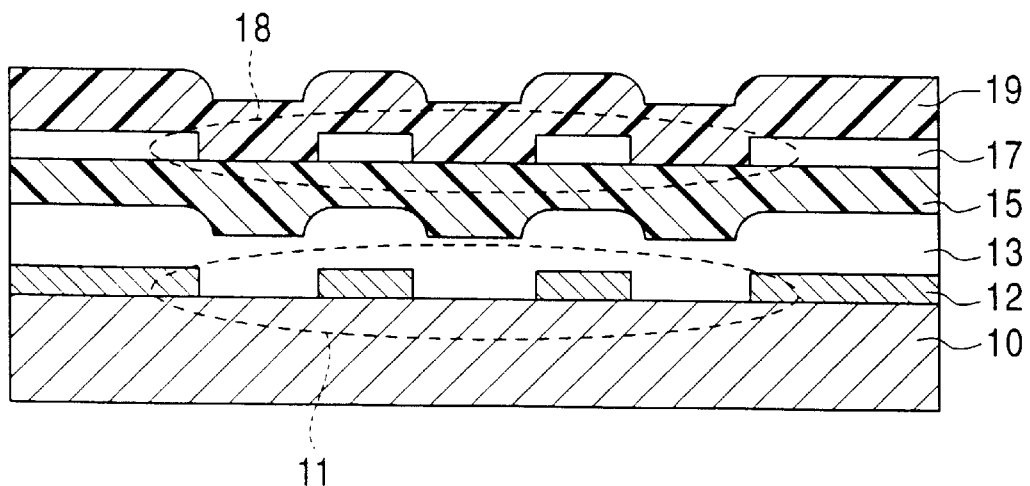
FIG. 7 is a sectional view that shows alignment marks according to a second embodiment of the present invention.

FIG. 7 is a sectional view of a semiconductor wafer that has alignment marks according to a second embodiment of the present invention. An intermediate insulating layer ($SiO_2$ layer) 12 is deposited on a silicon substrate 10. Thereafter, the first alignment mark 11 is formed by patterning the intermediate insulating layer 12.

An $SiO_2$ layer 13 that is a first interlayer is formed on the first alignment mark 11. In this embodiment, an aluminum layer 15 that is a wiring metal is formed on the $SiO_2$ layer 13, and the metal layer 15 undergoes flattening processing by the CMP, so that the surface thereof becomes substantially flat. An $SiO_2$ layer 17 that is a second interlayer is deposited on the flattened metal layer 15, and a second alignment mark 18 is formed. Thereafter, an aluminum layer 19 that is a wiring metal is deposited. Since the metal layer 15 is opaque to the alignment light, a highly accurate alignment process can be carried out without being influenced by the lower layers in performing the alignment that uses the second alignment mark 18. Further, the aforementioned process is suitable specifically for the wafer process of a semiconductor integrated circuit which includes a plurality of metal layer formation processing steps, such as a DRAM (Dynamic Random Access Memory) and an ASIC (Application-Specific Integrated Circuit).

[Third Embodiment]

Figure 8:
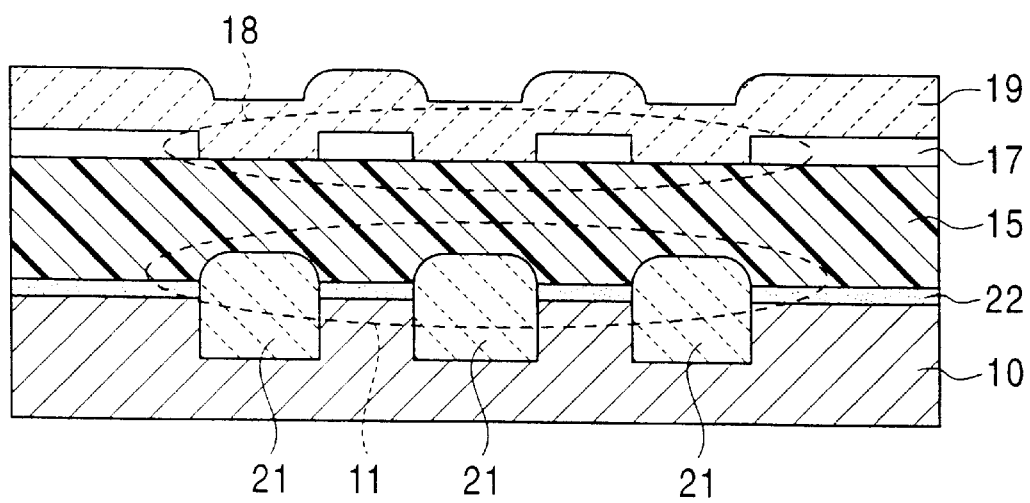
FIG. 8 is a sectional view that shows alignment marks according to a third embodiment of the present invention.

FIG. 8 is a sectional view of a semiconductor wafer that has alignment marks according to a third embodiment of the present invention. The silicon substrate 10 is first formed to have a rugged or grooved surface like a rectangular wave, and then insulators ($SiO_2$) 21 are buried in concave portions of the rugged surface so as to form the first alignment mark 11. A gate oxide layer 22 is formed on the flat part of the silicon substrate 10. A series of processes are carried out by using the first alignment mark 11. For example, the processes of patterning a photoresist by photolithography, ion implantation, etching, etc., are carried out.

Thereafter, an opaque layer opaque to alignment light, such as a polysilicon (Poly-Si) layer 15 used as a gate electrode, is deposited. Flattening processing is then applied to the polysilicon layer 15 so that the surface of the layer becomes substantially flat by the CMP process. A $SiO_2$ layer 17 that is an intermediate insulating layer is deposited on the flattened polysilicon layer 15 so as to form a second alignment mark 18. Then, an upper layer oxide layer ($SiO_2$ layer) 19 is deposited. Since the polysilicon layer 15 is opaque to alignment light, a highly accurate alignment process can be carried out without being influenced by the lower layers in performing the alignment process that uses the second alignment mark 18.

[Fourth Embodiment]

Figure 9:
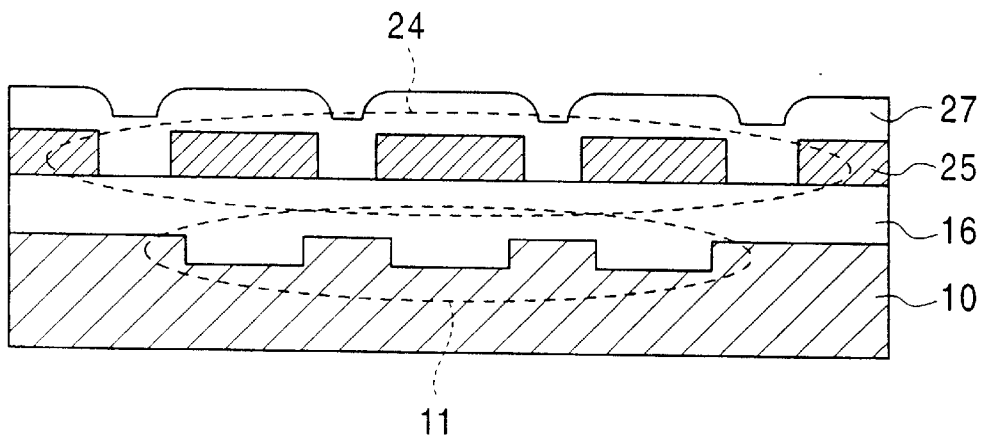
FIG. 9 is a sectional view that shows alignment marks according to a fourth embodiment of the present invention.

FIG. 9 is a sectional view of a semiconductor wafer that has alignment marks according to a fourth embodiment of the present invention. A first alignment mark 11 is formed like a rectangular wave on the silicon substrate 10. An upper layer 16 is formed on the first alignment mark 11. The upper layer 16 is made of a material, such as $SiO_2$, that is transparent to alignment light used for alignment.

Figure 10:
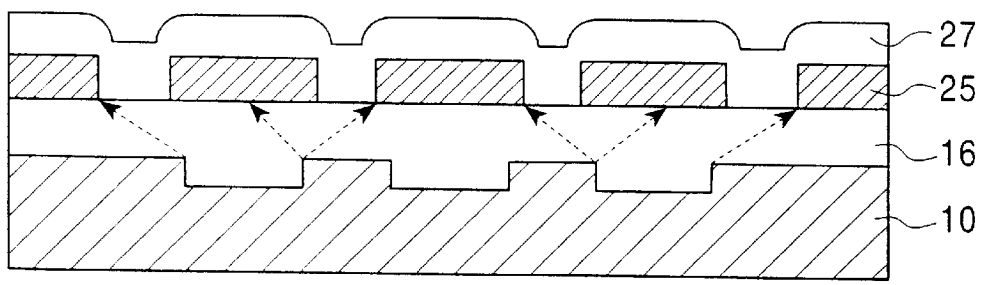
FIG. 10 is a sectional view showing that the second alignment mark intercepts reflected light (arrows in the figure) from the first alignment mark in the fourth embodiment of the present invention shown in FIG. 9.

The $SiO_2$ layer 16 undergoes flattening processing (for example, CMP), and the surface thereof becomes substantially flat. An opaque layer 25 that is opaque to the alignment light is deposited on the flattened $SiO_2$ layer 16, and a second alignment mark 24 is formed. The second alignment mark 24 is formed to have a different mark pattern from that of the first alignment mark 11. More specifically, the second alignment mark 24 is formed to cover concave portions formed in the silicon substrate 10 by a plurality of the first alignment marks 11. In other words, the second alignment mark 24 has a shape to intercept reflected light (arrows in the figure) from the first alignment mark as shown in FIG. 10. Reflected rays of light from the alignment marks become different between the first and second alignment marks by arranging the first and second alignment marks 11 and 24 in this manner. Therefore, the reflected rays of light are distinguished from each other on the basis of the difference, and either the first alignment mark or the second alignment mark can be used properly. It is noted that the layer 25 for forming the second alignment mark 24 is not limited to the opaque layer. What is necessary is that the second alignment mark is different in mark pattern from the first alignment mark so that a distinction can be drawn between the reflected light from the first alignment mark and the reflected light from the second alignment mark 24 even if it is a transparent layer.

Figure 11:
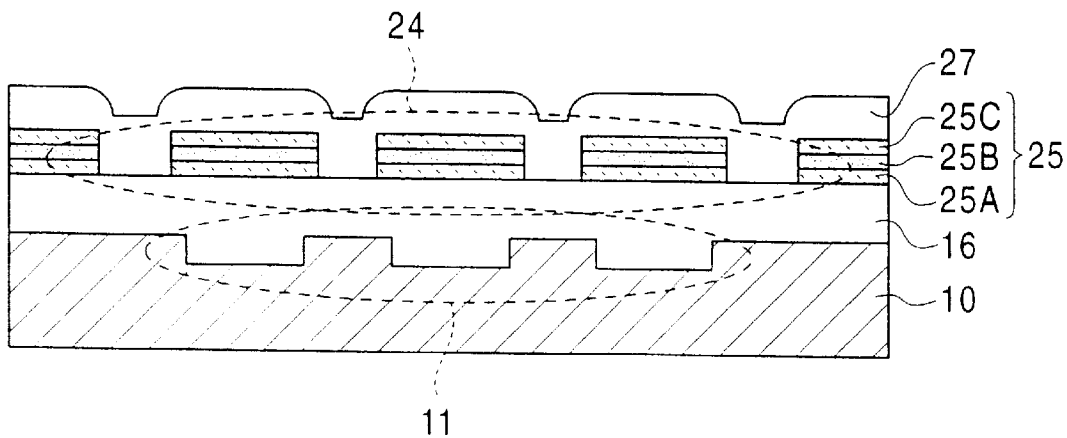
FIG. 11 is a sectional view of a semiconductor wafer that shows alignment marks according to a modification of the fourth embodiment of the present invention.

A modification of the embodiment will be described hereinafter with reference to FIG. 11. As shown in the figure, the layer 25 for forming the second alignment mark 24 includes of a plurality of layers 25A, 25B, and 25C. One of the layers, for example, the layer 25B may be an opaque layer. The structure makes it possible to perform a highly accurate alignment process without being influenced by the lower layers in alignment by the use of the second alignment mark 18.

As described in detail above, according to the present invention, alignment marks can be realized in which disposing areas can be reduced and highly accurate alignment can be performed. A description was given of the case, as an example, in which the CMP process is performed for flattening processing in the embodiments. However, the flattening method is not limited to the CMP process. Various processes may be used to make a surface substantially flat. For example, an etchback method can be used. Alternatively, there can be used a method in which a surface is made substantially flat in a layer depositing process. For example, a method can be used in which a surface is made substantially flat by adjusting temperature, pressure conditions, etc., in the CVD method or by adjusting pressure conditions, temperature of a substrate, etc., in a sputtering method.

The various embodiments mentioned above are examples, and they can be modified according to processes to be used, or the embodiments can be applied in combination.

As is apparent from above, according to the present invention, alignment marks necessary for wafer processing can be formed with high accuracy even if many processes are required in the processing.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

What is claimed is:

1. A method of forming alignment marks that can be detected by alignment light to form circuit elements on a substrate, comprising:
    forming a first alignment mark in an alignment mark forming area of the substrate;
    forming an opaque layer that is opaque to the alignment light on the first alignment mark;
    substantially flattening a surface of the opaque layer; and
    forming a second alignment mark on the flattened opaque layer so that at least a portion of the second alignment mark overlaps the first alignment mark.

2. A method according to claim 1, wherein the opaque layer includes a metal layer.

3. A method according to claim 1, wherein the opaque layer includes a semiconductor layer.

4. A method of forming alignment marks that can be detected by alignment light to form elements on a substrate, comprising:
    forming a first alignment mark in an alignment mark forming area of the substrate;
    forming an opaque layer that is opaque to the alignment light above the first alignment mark;
    substantially flattening a surface of the opaque layer; and
    forming a second alignment mark on a side where the alignment light is incident with respect to the flattened opaque layer, wherein the step of forming a first alignment mark includes forming a third alignment mark outside the alignment mark forming area, and said forming a second alignment mark is performed on the basis of the third alignment mark.

5. A method of forming alignment marks that can be detected by alignment light to form circuit elements on a substrate, comprising:

forming a first alignment mark in an alignment mark forming area of the substrate;

forming at least one layer on the first alignment mark;

substantially flattening a surface of the at least one layer; and forming a second alignment mark on the flattened surface of the at least one layer, so that at least a portion of the second alignment mark overlaps the first alignment mark.

6. A method according to claim 5, wherein the step of forming a second alignment mark includes forming an opaque layer that is opaque to the alignment light.

7. A method according to claim 5, wherein the second alignment mark has a shape so as to intercept reflected alignment light from the first alignment mark.

* * * * *